United States Patent [19]

Kurihara et al.

[11] Patent Number: 5,027,225
[45] Date of Patent: Jun. 25, 1991

[54] APPARATUS FOR FABRICATING PRE-PRESS MASKING FILM

[75] Inventors: Daiki Kurihara; Takashi Miyake, both of Kyoto, Japan

[73] Assignee: Dainippon Screen Mfg. Co., Ltd., Japan

[21] Appl. No.: 304,720

[22] Filed: Jan. 31, 1989

[30] Foreign Application Priority Data

Feb. 1, 1988 [JP] Japan .................. 63-21686

[51] Int. Cl.⁵ ............................................. H04N 1/40
[52] U.S. Cl. .................................. 358/448; 358/450; 358/452
[58] Field of Search ............ 358/401, 448, 450, 488, 358/452, 443, 75, 78; 382/46

[56] References Cited

U.S. PATENT DOCUMENTS

| | | | |
|---|---|---|---|
| 4,231,069 | 10/1980 | Wellendorf et al. | 358/450 |
| 4,652,936 | 3/1987 | Hatayama | 358/450 |
| 4,672,462 | 6/1987 | Yamada | 358/401 |
| 4,679,155 | 7/1987 | Mitsuka | 358/450 |
| 4,683,500 | 7/1987 | Kitamura et al. | 358/450 |
| 4,684,979 | 8/1987 | Hirosawa | 358/450 |
| 4,691,238 | 9/1987 | Yamada | 358/450 |
| 4,723,297 | 2/1988 | Postl | 358/448 |

Primary Examiner—Joseph A. Orsino
Assistant Examiner—Thomas D. Lee
Attorney, Agent, or Firm—Ostrolenk, Faber, Gerb & Soffen

[57] ABSTRACT

An apparatus for fabricating a pre-press masking film used for correcting a color printing plate which is slightly tilted by a scanner based on an image edited by a layout system. The apparatus includes a coordinate data input unit for inputting coordinate data defining a trimming frame designated by the layout system, a tilt correcting unit for compensating for the tilt of the color printing plate by correcting the coordinate data, a unit for generating driving signals for forming a pre-press masking film based on the corrected coordinate data, and a cutter unit responsive to the driving signal for forming a pre-press masking film for cutting the masking film.

11 Claims, 9 Drawing Sheets

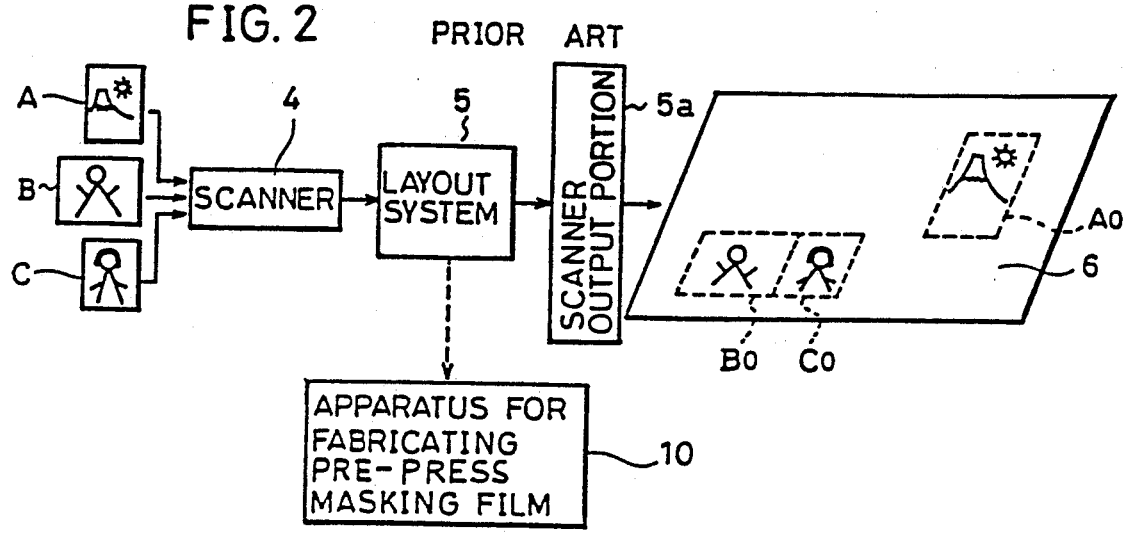
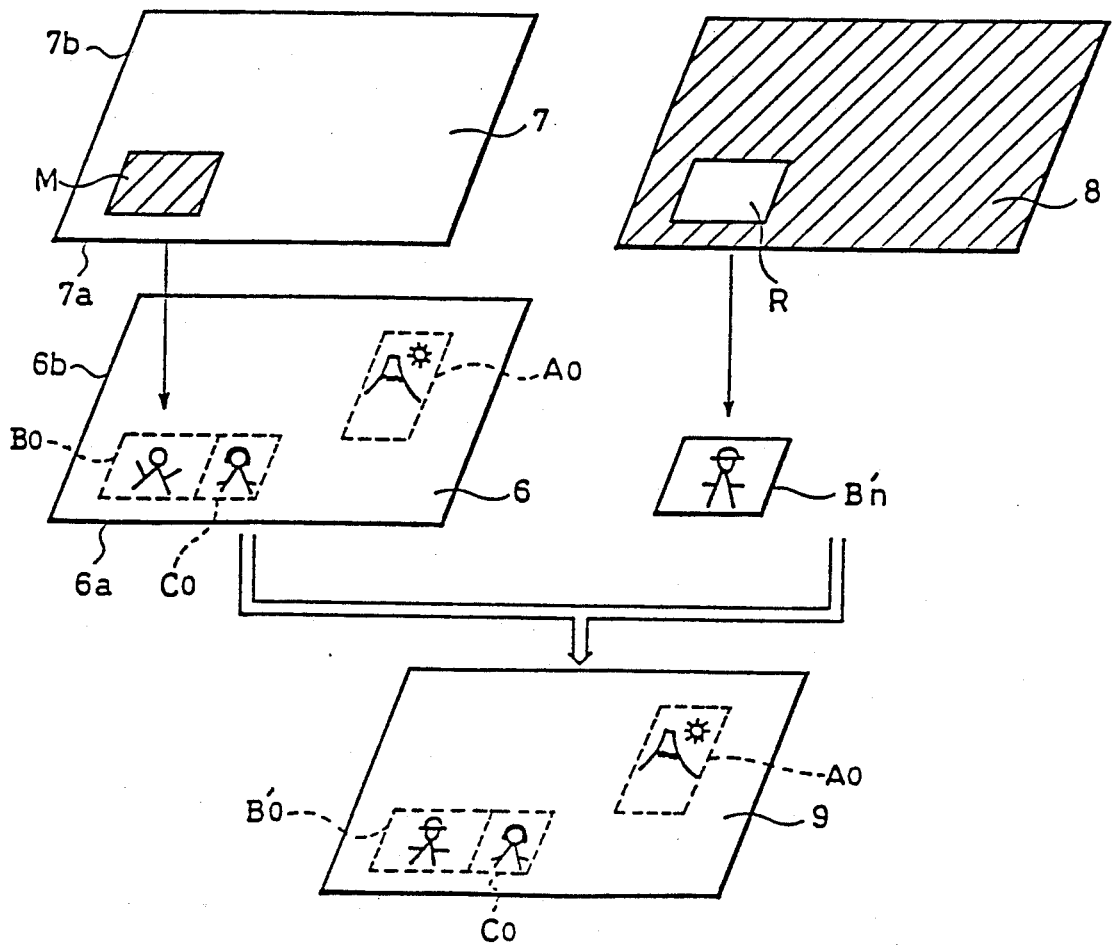

| MOVE ; $x_0, y_0$ |
| --- |
| L1 ; $x_1, y_1$ |
| L2 ; $x_2, y_2$ |
| L3 ; $x_3, y_3$ |
| L4 ; $x_4, y_4$ |

| $Px_1$ |
| --- |
| $Py_1$ |
| $\phi_1$ |
| $\ell_1$ |
| $V_1$ |
| $\alpha_1$ |
| CONTROL INFORMATION |

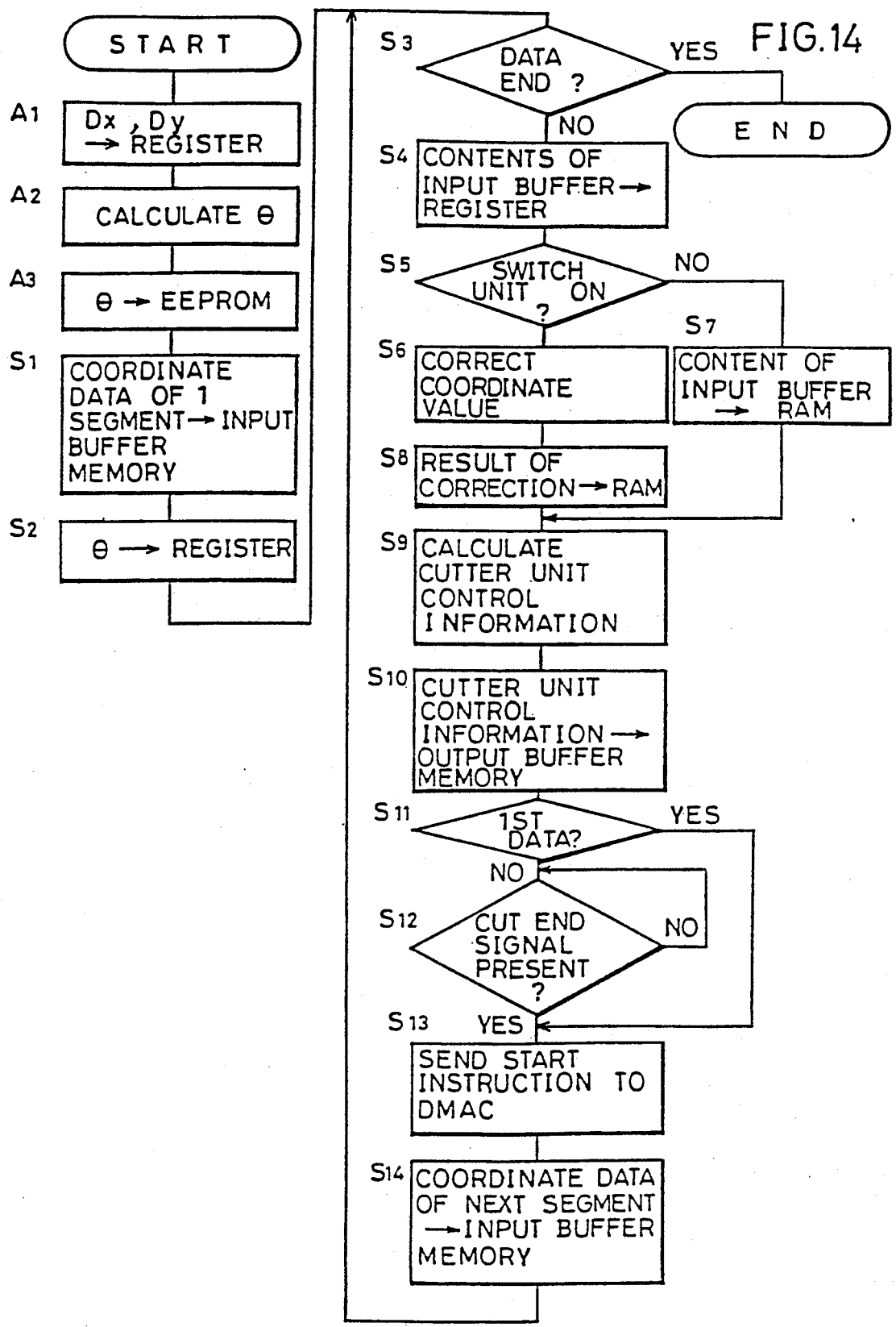

APPARATUS FOR FABRICATING PRE-PRESS MASKING FILM

BACKGROUND OF THE INVENTION

1. Field of the Invention

The present invention relates to an apparatus for fabricating a pre-press, i.e., a preprinting, masking film and, more specifically, to an apparatus for fabricating a masking film employed when different images are to be exposed on different portions of a photosensitive film or the like.

2. Description of the Background Art

In some steps of the pre-press process, a positive film is required on which designated characters or photographs of designated sizes are arranged at designated positions. An outline of a manual pre-press process will be described below with reference to FIG. 1. FIG. 1 shows the steps for providing a positive film 3. A plurality of film negatives a and b are fixed on the desired positions of a transparent film 1a such as a polyester film by means of transparent tapes. In the similar manner, a film negative c is fixed on a transparent film 1b. In the example shown in FIG. 1, the images b and c must be arranged in contact with each other on the positive film in a so-called "hairline register" manner (with no space therebetween). For this purpose, the film negatives b and c are applied on separate transparent films.

Colorless transparent portions r, s and t are formed in mask films 2a and 2b, which are peel-off films comprising a colorless transparent film and a color-dyed transparent film such as a red transparent film overlapping each other, by means of an apparatus for fabricating a pre-press masking film (an automatic plotter with a cutter attached on a head thereof). The colorless transparent portions r, s and t are formed by cutting and peeling off those portions of the color-dyed transparent films which corresponds to trimming frames of the images a, b and c. The colorless transparent portions r, s and t are formed to be a little smaller than the film negatives a, b and c.

The transparent film 1a is laid over with the mask film 2a such that the colorless transparent portions r and s are registered with the film negatives a and b. The transparent film 1 is laid over with the mask film 2b such that the colorless transparent portion t is registered with the film negative c. The exposure of the photosensitive film is carried out twice using these two sets of overlapped films. Consequently, a positive film 3 is provided on which the images $a_0$, $b_0$ and $c_0$ are arranged at desired positions. The above described steps are carried out for respective color printing plates of yellow (Y), magenta (M) cyan (C) and black (K) for multicolor printing.

The steps for correcting the positive film 3 will be described in the following. In this example, the image $b_0$ on the positive film 3 is replaced with another image. First, the film negative b is removed from the transparent film 1a. A new film negative b' (not shown) is fixed by means of transparent tapes or the like at that position at which the film negative was fixed. The mask film 2a provided for the film negative b can be used as the mask for the new film negative b'. By carrying out the same steps as described above, a corrected positive film is provided.

Recently, a layout system employing image processing technology of computers has been incorporated in the pre-press process to replace the manual process. The outline of the layout system will be described with reference to FIG. 2. As shown in FIG. 2, respective images of photographs A, B and C are read by a scanner 4. The read image data are inputted to the layout system 5. Coordinate data for designating trimming frames of the respective images $A_0$, $B_0$ and $C_0$ of the photographs A, B and C are inputted into the layout system 5 in advance by means of a digitizer or the like. The layout system 5 arranges the respective images $A_0$, $B_0$ and $C_0$ of the photographs A, B and C read from the scanner 4 at the desired positions in accordance with the coordinate data. The arranged images are printed on one negative film 6 for each of respective color printing plates through a scanner output portion 5a. The negative film 6 is printed to be solid except for portions of the images $A_0$, $B_0$ and $C_0$ No mask film is used in obtaining the negative film 6.

There are various methods for correcting the negative film 6. Some of the correcting methods will be described with reference to a case in which the image $B_0$ of the photographs B out of the three photographs A, B and C is replaced with another image of another photograph.

In a first method, a new photograph is set instead of the photograph B to be read by the scanner. A corrected negative film is obtained by using the scanner 4, the layout system 5 and the scanner output portion 5a in a manner similar as in the case of the photograph B. However, in this method, the same steps must be carried out twice. Therefore, it requires much time to provide the corrected film. Such repetition is not desired from the point of view of obtaining the most use of the layout system 5. p In view of the foregoing, another method has been used. In this method, a masking film formed by manual operation or by an apparatus for fabricating a pre-press masking film is used. The previously obtained negative film 6 and a film negative of the new photograph for replacement which is directly color separated by the scanner 4 are combined.

The correction carried out by using the apparatus for fabricating pre-press masking film will be described with reference to FIGS. 2 and 3. The coordinate data in association with the shape and position of the trimming frame of the image $B_0$ on the negative film 6 are inputted to the conventional apparatus for fabricating a pre-press masking film. A portion of a color-dyed transparent film of a first masking film 7 is cut in accordance with the inputted coordinate data, thereby providing a masking portion M. The remaining portions of the color-dyed transparent film are peeled off and removed, leaving the masking portion M. A portion of the color-dyed transparent film of a second masking film 8 is cut in accordance with the shape and position of the trimming frame (generally the same as that of the image $B_0$) of the image $B_0'$ of the new photograph B' (not shown) for replacement. The cut portion of the color-dyed transparent film is removed to provide a colorless transparent portion R.

The negative film 6 is laid over with the first masking film 7 to be corrected such that the image $B_0$ which is to be replaced is in registration with the masking portion M. The film negative $B_n'$ of the photograph B, (not shown) for replacement is laid over with the second masking film 8 such that the film negative $B_n'$ is registered with the colorless transparent portion R. The images of the two sets of the overlapped films are combined on a positive film 9 by multiple exposure. The image $B_0$ of the photograph B is replaced with the image $B_0'$ of the photograph B' (not shown) on the positive film 9. The above described operation is repeated four times to provide four color printing plates.

However, the above described prior art comprises some disadvantages. One of the disadvantages is that the corrected positive film is inferior in quality when the negative film is corrected by using a masking film fabricated in the conventional manner. The above described problem occurs more frequently especially when a negative film is to be corrected on which images edited by a layout system are exposed by means of a rotary cylinder scanner. The problem is due to the fact that when image data are arranged by the layout system and output and exposure are carried out by the scanner based on the arranged data, the formed images are tilted, though very slightly, in the subscanning direction.

More specifically, referring to FIG. 3, the shapes corresponding to the trimming frames of the images $A_0$, $B_0$ and $C_0$ on the negative film 6 are designated as rectangles. However, the shapes corresponding to the trimming frames are actually formed to be parallelograms. One example is shown in FIG. 4.

Referring to FIG. 4, the trimming sides $m_1$ and $m_2$ of the image $B_0$ on the negative film 6 are parallel to a subscanning direction X. However, the trimming sides $m_3$ and $m_4$ are not parallel to the main scanning direction Y. Namely, the trimming sides $m_3$ and $m_4$ are tilted by a small angle $\theta$ from the main scanning direction Y due to the scanning operation. It should be noted that the angle $\theta$ is considerably exaggerated in FIG. 4 for convenience. It is assumed that a position of a point on the trimming side $m_3$ in the X direction changes by the length $L_X$ for the length $L_Y$ in the Y direction. Actually, the lengths $L_X$ and $L_Y$ are in the ratio 50 $\mu$m:0.5 m=1:10,000. Namely, the tilt is very small which presents no problem in general, except in the case of the above described correction.

Meanwhile, in a conventional apparatus 10 for fabricating a pre-press masking film, a rectangular trimming area is usually designated by coordinate data which defines a rectangle. Consequently, the masking portion M and the colorless transparent portion R are formed to be rectangles, as shown in FIG. 5. Namely, the sides $n_1$ and $n_2$ of the masking portion M or the colorless transparent portion R are considered to be orthogonally intersecting with the sides $n_3$ and $n_4$. As a result, the problems occur on the corrected positive film 9. Namely, a very thin hairlike transparent portion remains unprinted along a side of the newly provided image $B_0'$ which is adjacent to the side $n_4$. Sometimes, a hairlike thin line is generated at the boundary of images at the same portion as the images $B_0'$ and $C_0$ are printed overlap each other. Consequently, the resulting printed material is inferior in quality.

The masking films can be manually fabricated in order to solve the above described problems. However, it is very difficult even for a highly skilled person to provide a highly precise masking film by manual operation. The manual fabrication requires much time and labor.

A method for fabricating a pre-press masking film to solve the above described problems is disclosed in Japanese Patent Publication Gazette No. 55136/1987, which method is of interest to the present invention. Generally, a block copy paper is reduced in size during the steps of pre-press process due to the influences of temperature and other factors. When the block copy is photographed, the images thereon are deformed due to the spherical aberration of the taking lens. Consequently, there will be differences in positions and scales between the masking portions or the colorless transparent portions formed on the masking film and the images formed on the positive film. The above mentioned method for fabricating a pre-press masking film is to cancel the above described differences. According to this method, the coordinate data representing the trimming frame designated by the layout system are corrected. The corrected coordinate data are transmitted to the common apparatus for fabricating a pre-press masking films. Consequently, a masking film having the masking portion or the colorless transparent portion transformed as desired can be provided. However, in the above mentioned publication, there is no disclosure of a preferable apparatus for realizing the above described method. There is a need for apparatuses capable of realizing the above described method.

SUMMARY OF THE INVENTION

Therefore, one aspect of the present invention is to provide a means for fabricating a pre-press masking film capable of compensating for the tilt of images generated by a scanner to carry out the above described method for fabricating a pre-press masking film.

Another aspect of the present invention is to provide a means for fabricating a pre-press masking film capable of preventing deterioration of prints caused by the tilt of images derived from scanning when a positive film is corrected.

An additional aspect of the present invention is to provide a means for fabricating a pre-press masking film capable, by a simple operation, of preventing deterioration of prints caused by scanning when a positive film is corrected.

In accordance with the present invention, a means for fabricating a pre-press masking film is to be combined with an original layout means including a scanning unit for scanning an original image to generate electric signals representing the original image, an image processing unit for electrically processing electric signals based on given coordinate data representing the area corresponding to the original image to generate electric signals representing the original image, the coordinate data including a prescribed coordinate system, and an original image reconstructing unit responsive to the electric signals representing the laid out original image to reconstruct the laid out original image, the original images reconstructed by the original image reconstructing unit including a tilt caused by the reconstruction in association with the original images represented by the signals processed in the image processing unit, the means for fabricating a pre-press masking film is adapted to carry out prescribed correction on the coordinate data to form a trimming frame on a masking film for pre-press based on the corrected coordinate data, the means comprising: coordinate data input means coupled to the image processing unit for receiving coordinate data; correcting means coupled to the coordinate data inputting means for correcting coordinate data to compensate for the tilt; first means responsive to the corrected coordinate data for generating driving signals for forming a pre-press masking film; and means for forming the pre-press masking film in response to the driving signals for forming pre-press masking films.

The means for fabricating a pre-press masking film in accordance with the present invention comprises the above described components. The coordinate data representing the area corresponding to the original image are inputted to the means for fabricating a pre-press masking film by means of the coordinate data inputting means. The correcting means corrects the coordinate data such that the corrected coordinate data represent the shape of the area corresponding to the original image reconstructed by the original image reconstructing unit including the tilt. The first means generates driving signals for forming a pre-press masking film, which signals drive the means for forming a pre-press masking film in accordance with the corrected coordinate data. The means for forming a pre-press masking film forms a masking film having a trimming frame with a shape corresponding to the corrected coordinate data in response to the driving signal for forming a pre-press masking film.

Consequently, the shape of the masking portion or the colorless transparent portion formed on the pre-press masking film is compensated for the tilt of the shape of the area corresponding to the original image reconstructed by the original reconstructing unit such as a scanner. Namely, a means for fabricating a pre-press masking film capable of compensating for the tilt of images generated by a scanner is provided.

In accordance with a preferred embodiment of the present invention, in a means for fabricating a pre-press masking film, the area corresponding to the original image comprises an arbitrary polygon, the correction is carried out based on tilt correction data for tilting and deforming the area corresponding to the original image, and the correcting means comprises a tilt correcting means for compensating for the tilt deformation.

Therefore, with the means for fabricating a pre-press masking film, the area corresponding to the original image on the reconstructed image includes a tilted deformation in association with the polygonal area corresponding to the original image on the original represented by signals processed in the image processing unit. The tilt correcting means tilts and deforms the shape of the masking portion or the colorless transparent portion of the masking film into a polygon which matches the area corresponding to the original image on the reconstructed original. Therefore, the following advantages are provided when multiple exposure is carried out on a photosensitive material employing the masking film in order to replace an image in a prescribed area corresponding to the original image on the reconstructed original with another image. Namely, the border between an area exposed on the photosensitive material and an area which is masked correspond without fail to the border between a prescribed area corresponding to the original image and other areas on the reconstructed original. Consequently, the borders between a plurality of images formed on the photosensitive material by independent exposures correspond to each other. Therefore, there is neither the possibility of images exposed overlapping with each other on the photosensitive material nor the possibility of a portion of the photosensitive material being left unexposed. Accordingly, there will be no defects in the resulting print even when the color printing plate is corrected.

Consequently, a means for forming a pre-press masking film can be provided which is capable of preventing deterioration of prints caused by the tilting of images generated by a scanner or the like.

In accordance with another preferred embodiment of the present invention, in a means for fabricating a pre-press masking film, the tilt correcting means comprises tilt correcting data outputting means and transforming means connected to the tilt correcting data outputting means and to the coordinate data inputting means for correcting the coordinate data based on the tilt correcting data, the tilt correcting data including a plurality of tilt correcting data, the tilt correcting data outputting means including memory means for storing in advance a plurality of tilt correcting data and tilt correcting data selecting means connected to the transforming means and to the memory means for selecting one of the plurality of tilt correcting data to output the selected tilt correcting data to the transforming means.

Therefore, when masking films are fabricated by means of the means for fabricating the pre-press masking films, an operator does not have to carry out complicated operations. The operator only has to select one of the tilt correcting data stored in the memory means by means of the tilt correcting means. No skill is needed in selecting the tilt correcting data.

Therefore, a means for fabricating a pre-press masking film capable of preventing, by a simple operation, deterioration of prints caused by a scanner in correcting color printing plates can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a block diagram showing a concept of a pre-press process employing a layout system;

FIG. 3 is a schematic diagram showing steps for correcting film negatives formed by a conventional layout system;

FIG. 14 is a flow chart showing control of a program in the embodiment of the present invention employing the microcomputer.

DESCRIPTION OF THE PREFERRED EMBODIMENTS

Figure 6:
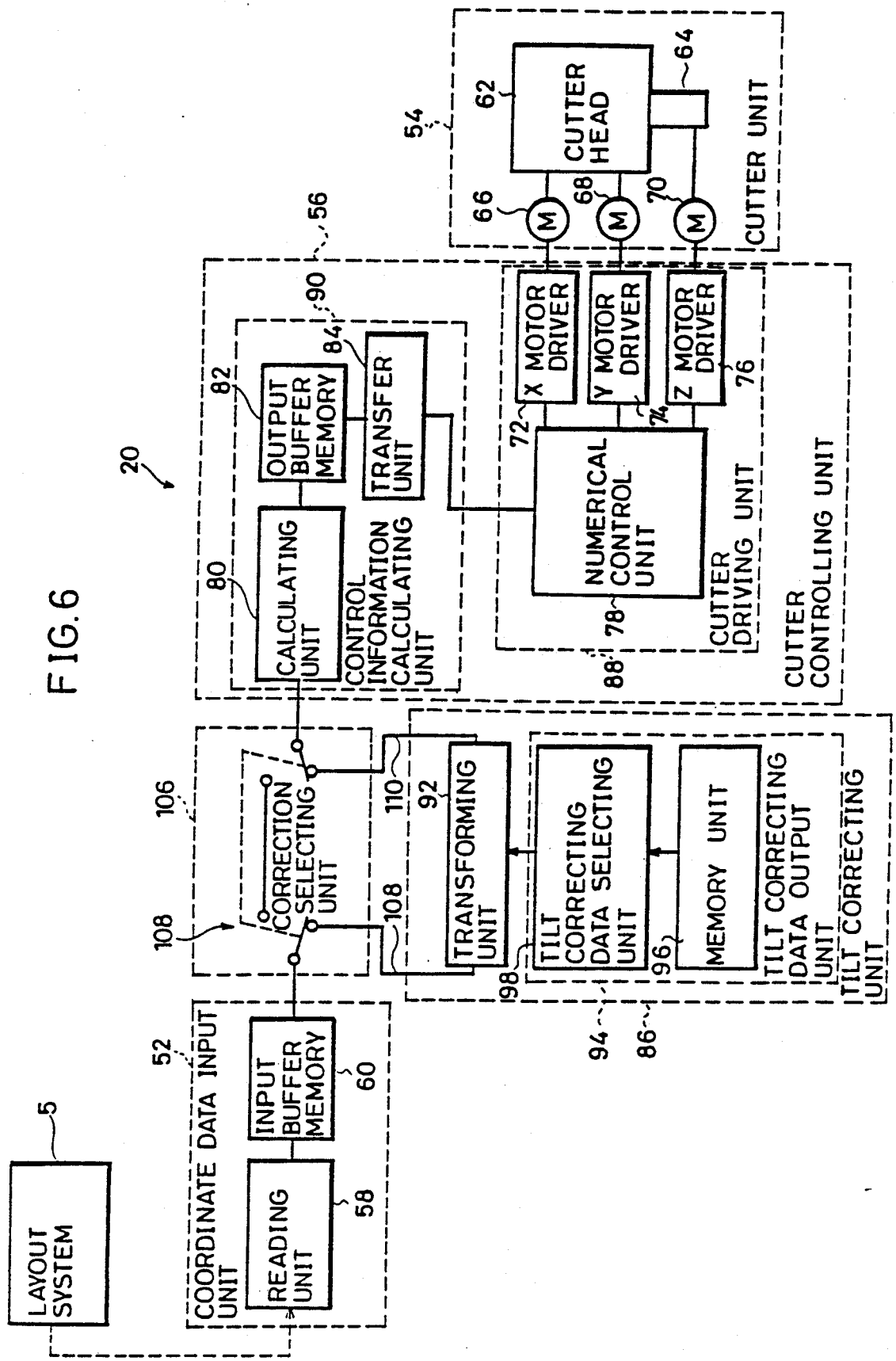
FIG. 6 is a block diagram of one embodiment of the apparatus for fabricating a pre-press masking film in accordance with the present invention.

FIG. 6 is a block diagram of one example of an apparatus for fabricating a pre-press masking film in accordance with the present invention. Referring to FIG. 6, the apparatus 20 for fabricating a pre-press masking film comprises: coordinate data input unit 52 for inputting coordinate data for designating a position, size and shape of a trimming frame from a layout system 5 through a memory medium such as a floppy disk; a cutter unit 54 for cutting a color-dyed transparent film of a peel-off film to fabricate a masking film; tilt correcting unit 86 for correcting coordinate data so as to form a trimming frame corresponding to the tilted deformation of an image on a negative film outputted from a scanner output portion or the like; cutter control unit 56 connected to the tilt correcting unit 86 for generating driving signals for driving and controlling the cutter unit 54 based on the coordinate data; and correction selecting unit 106 provided between the coordinate data input unit 52 and the cutter control unit 56 for detachably connecting the tilt correcting unit 86 between the coordinate data input unit 52 and the cutter control unit 56.

The coordinate data input unit 52 comprises reading unit 58 for reading coordinate data and an input buffer memory 60 for temporarily storing the read coordinate data. The cutter unit 54 comprises a cutter head 62 which is controlled in intersecting two directions (x direction and y direction) simultaneously and independently such that it moves on a peel-off film, and a cutter 64 provided on the cutter head 62 for cutting only the color-dyed transparent film of the peel-off film. The cutter 64 can be moved upward and downward orthogonally to the x and y directions (this direction is referred to as z direction). The angle of the cutter 64 in the z direction is adjustable. The cutter unit 54 further comprises an x pulse motor 66 and a y pulse motor for respectively moving the cutter head 62 in the x and y directions, and a z pulse motor 70 for adjusting the angle of the cutter 64 about the axis of the z direction.

The cutter control unit 56 comprises cutter driving unit 88 for driving the x pulse motor 66, the y pulse motor 68 and the z pulsed motor 70 by pulse instructing signals, and control information calculating unit 90 for calculating control information such as number of pulses for driving each of the pulse motors in the cutter unit 54 based on the coordinate data corrected by the tilt correcting unit 86 to transfer the same to the cutter driving unit 88.

The cutter driving unit 88 comprises an x motor driver 72 for driving the x pulse motor 66, a y motor driver 74 for driving the y pulse motor 68, a z motor driver 76 for driving the z pulse motor 70 and numerical control unit 78 for systematically operating the x motor driver 72, the y motor driver 74 and the z motor driver 76 based on the control information outputted from the control information calculating unit 90.

The control information calculating unit 90 comprises calculating unit 80 connected to the correction selecting unit 106 for calculating control information for driving each of the pulse motors based on the coordinate data, an output buffer memory 82 connected to the calculating unit 80 for temporarily storing the control information, and transfer unit 84 connected to the output buffer memory 82 for transferring the control information to the cutter driving unit 88.

The tilt correcting unit 86 comprises a transforming unit 92 connected to the correction selecting unit 106, receives coordinate data from the input buffer memory 60 for correcting the coordinate data as needed to input the same to the calculating unit 80 and tilt correction data output unit 94 for applying information for the correction, that is, the tilt correction data to the transforming unit 92. The tilt correction data output unit 94 comprises memory unit 96 for storing in advance a plurality of tilt correction data corresponding to the types of scanners employed in forming images on a negative film, and tilt correction data selecting unit 98 connected to the memory unit 96 adapted to allow an operator to select a desired one from the plurality of tilt correction data stored in the memory unit 96 for applying the selected tilt correction data to the transforming unit. The correction selecting unit 106 comprises switching unit 108 for switching between a valid mode and an invalid mode of the tilt correcting unit 86.

The operation of the apparatus will be briefly described with reference to FIG. 6. The reading unit 58 reads a predetermined single unit of the coordinate data (for example, data representing one line) designating a trimming frame from a floppy disk or the like, which data are stored in the input buffer memory 60. When the correction is invalid, the correction selecting unit 106 directly connects the input buffer memory 60 to the calculating unit 80. In that case, the coordinate data is not corrected, and the same operation as the conventional apparatus for fabricating a pre-press masking film is carried out.

The apparatus operates as follows when the correction is valid. The input buffer memory 60 is connected to the transforming unit 92. One unit of the coordinate data is inputted to the transforming unit 92. One of the plurality of tilt correcting data stored in the memory unit 96 is however previously selected by the operator by means of the tilt correction data selecting unit 98. The transforming unit 92 corrects the coordinate data as needed based on the selected tilt correction data and outputs the same to the calculating unit 80. More specifically, the coordinate data representing the trimming frame is corrected such that they correspond to the actual tilted trimming frame of the images formed on the negative film by the scanner.

The calculating unit 80 calculates control information for driving the cutter unit 54 based on the corrected coordinate data and outputs the same to the output buffer memory 82. The transfer unit 84 transfers the contents of the output buffer memory 82 to the numerical control unit 78.

The numerical control unit 78 drives the z motor driver 76 to adjust the cutter 64 in a prescribed direction. Thereafter, the numerical control unit 78 simultaneously drives the x motor driver 72 and y motor driver 74 to move the cutter head 62 in a prescribed direction by a prescribed distance. Consequently, the cutter 64 cuts only the color dyed transparent film of the peel off film.

Then the reading unit 58 reads the next unit of coordinate data. The above described operation is repeated to form an outline of a trimming frame, which is tilted as needed, on the color dyed transparent film of the peel off film by means of the cutter 64. By peeling off that portion of the color-dyed transparent film in the trimming frame, the colorless transparent portion R shown in FIG. 3 is provided. Similarly, the peeling off all the portions of the color-dyed transparent film except the portion in the trimming frame, the masking portion M is provided.

Figure 7:
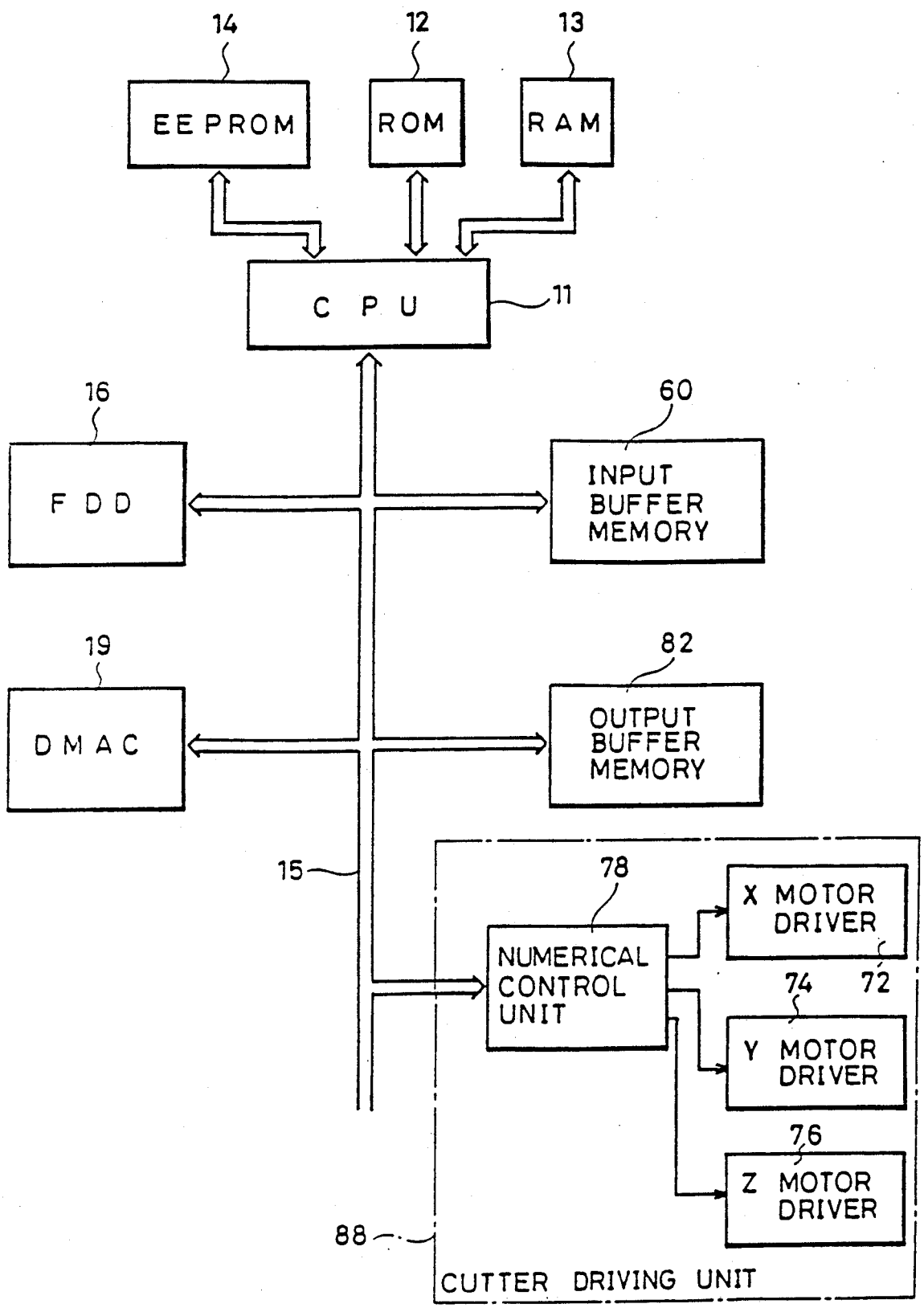
FIG. 7 is a schematic block diagram showing on embodiment of the apparatus for fabricating a pre-press masking film in accordance with the present invention which employs a microcomputer.

FIG. 7 is a schematic diagram showing a main portion of one embodiment of the apparatus for fabricating a pre-press masking film in accordance with the present invention which employs a microcomputer. Referring to FIG. 7, the apparatus for fabricating a pre-press masking film comprises a CPU (Central Processing Unit) 11 of the microcomputer serving as the transforming unit 92 and the calculating unit 80 shown in FIG. 6, a ROM (Read Only Memory) 12 for storing programs for operating the CPU 11, a RAM (Random Access Memory) 13 serving as a memory for the CPU 11, an EEPROM (Electrically Erasable Programmable Read Only Memory) 14 for storing tilt correction data, a bus 15 connected to the CPU 11, a floppy disk driver (FDD) serving as the reading unit connected to the bus 15, an input buffer memory 60 connected to the bus 15 for storing coordinate data read by the FDD 16, an output buffer memory 82 connected to the bus 15 for temporarily storing control information calculated and outputted by the CPU 11, a numerical control unit 78 for controlling the x motor driver 72, y motor driver 74 and the z motor driver 76, respectively, based on the contents of the output buffer memory 82, and a direct memory access controller (DMAC) 19 for transferring the contents of the output buffer memory 82 to the numerical control unit 78 independent of the CPU 11. Previously selected tilt correction data are stored in the EEPROM 14.

The operation of this apparatus is described with reference to FIG. 7 as follows. Coordinate data represented by x, y rectangular coordinate system of the masking portion M or the colorless transparent portion R to be formed on the peel off film 7 or 8 are stored in a floppy disk (not shown) set in the FDD 16. The format of the coordinate data representing the shape of FIG. 8 will be described with an example. In order to form the polygon of FIG. 8, the following coordinate data are needed, namely, the coordinate data $(x_0, y_0)$ for defining the initial position $Q_0$ of the cutter 64, the coordinate data $(x_1, y_1)$ for defining a first position $Q_1$ to which the cutter linearly moves from the initial position $Q_0$, the coordinate data $(x_2, y_2)$, $(x_3, y_3)$ . . . for defining second position $Q_2$, third position $Q_3$ . . . . The above described coordinate data are stored in the floppy disk in the manner shown in FIG. 9, in which the data correspond to the initial position and the segments $L_1$, $L_2$, $L_3$ . . . . The coordinate data are read from the floppy disk to the FDD 16 by the CPU 11. The coordinate data are stored in the input buffer memory 60. The CPU 11 corrects the coordinate data stored in the input buffer memory 60 based on the program stored in the ROM 12. On this occasion, the tilt correction data in the EEPROM 14 are referred to. The corrected results are stored in the RAM 13 The method of correction will be described in detail afterward.

The unit of the coordinate data stored in the RAM 13 is "length". Meanwhile, the definition of the data to be outputted from the numerical control unit 78 is "number of pulses". Therefore, the coordinate data in the RAM 13 cannot be directly inputted to the numerical control unit 78 as they are. Accordingly, arithmetic processing for converting the data representing the length into the data representing the number of pulses is carried out in the CPU 11. The data representing the number of pulses are stored in the output buffer memory 82. The CPU 11 calculates not only data corresponding to a number of pulses but other control information such as angles of respective segments in association with the x axis, the length l of movement, the velocity V of the movement of the cutter 64 along the segment, the acceleration α based on the coordinate data read from the RAM 13. Such information is also stored in the output buffer memory 82.

Figures 8, 9, 10:
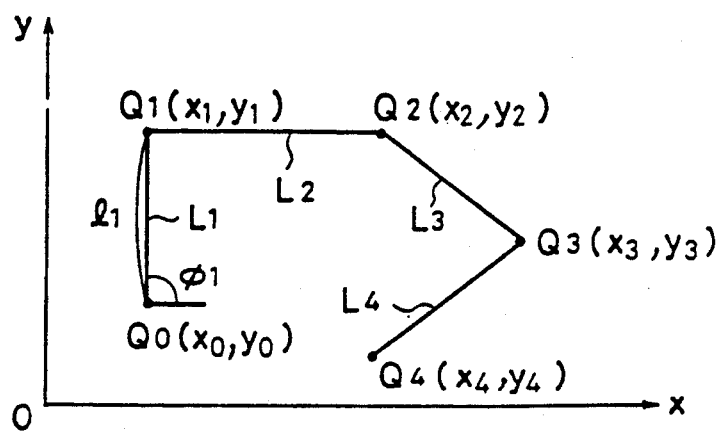
FIG. 8 is a graph showing an example of a figure formed by a cutter.
FIG. 9 illustrates a manner of recording coordinate data stored in a floppy disk.
FIG. 10 illustrates one example of recording control information in a buffer for a driving a cutter unit.

The control information will be described briefly in the following with reference to FIGS. 8 to 10. For example, in association with the first segment L1 shown in FIG. 8, the coordinate data stored in the RAM 13 when the image is not corrected is $(x_0, y_0)$, $(x_1, y_1)$ as shown in FIG. 9. The CPU 11 calculates control information data of the cutter unit such as the number of pulses $Px_1$ in the x direction, the number of pulses $Py_1$ in the y direction, the angle $\phi_1$ of the cutter blade in association with the x axis, the length $l_1$ of movement, the velocity $V_1$ of movement, the acceleration $\alpha_1$ based on the coordinate data. These values are stored in the output buffer memory 82. FIG. 10 shows how the data are stored in the output buffer memory 82. The CPU 11 applies a start instruction to the DMAC 19 after the results of calculation are stored in the output buffer memory 82. Thereafter, the coordinate data $(x_1, y_1)$ $(x_2, y_2)$ of the second segment $L_2$ are read by the operation of the CPU 11, and the same operation as described above is repeated.

The DMAC 19 receives the start instruction from the CPU 11 to transfer the control information stored in the output buffer memory 82 directly to the numerical control unit 78 independent of the CPU 11.

The numerical control unit 78 first drives the z motor driver 76 and therefore the z motor 70 based on the angle $\phi_1$ to adjust the angle of the cutter 64 about the z direction. Thereafter, the numerical control unit 78 outputs data of the number of pulses $Px_1$ in the x direction and of the number of pulses $Py_1$ in the y direction respectively to the x and y pulse motors 66 and 68 through the x and y motor drivers 72 and 74. The velocity of movement of the cutter 64 is generally controlled to be a maximum velocity $V_1$.

By the operation of the x pulse motor 66 and the y pulse motor 68, the cutter head is moved at a desired relative velocity independently in the x and y directions. As a result, the first segment of the trimming frame is formed by the cutter on the color-dyed film of the peel-off film.

During this time period, the CPU 11 corrects the data of the second segment $L_2$ read from the input buffer memory 60, provides the control information of the pulse motors based on the corrected coordinate data and stores the same in the output buffer memory 82.

When the storage of the output data of the second segment L2 into the output buffer memory 82 is completed and the signal indicating completion of cutting the first segment L1 reaches the CPU 11 from the numerical control unit 78 through the bus 15, the CPU 11 again applies a start instruction to the DMAC 19. The DMAC 19 transfers the output data to the numerical control unit 78 for the second segment L2 in the similar manner as described above. The numerical control unit 78 controls the cutting of the second segment L2 in a manner as described above. The same operation is repeated for the third and fourth segments L3 and L4.

Referring to FIG. 3, the masking portion M or the colorless transparent portion R of the masking film 7 or 8 is formed at the same position and has the same shape as the image $B_0$ of the photograph B to be replaced with by the cutter carrying out the above described operation.

One of the main characteristics of the present invention is that the tilt correcting unit 86 corrects the coordinate data representing the trimming frame designated by the layout system 5 such that the coordinate data correspond to the shape of the trimming frame of the images formed slightly tilted on the negative film by the scanner. How the coordinate data is corrected will be described in the following.

Figure 11:
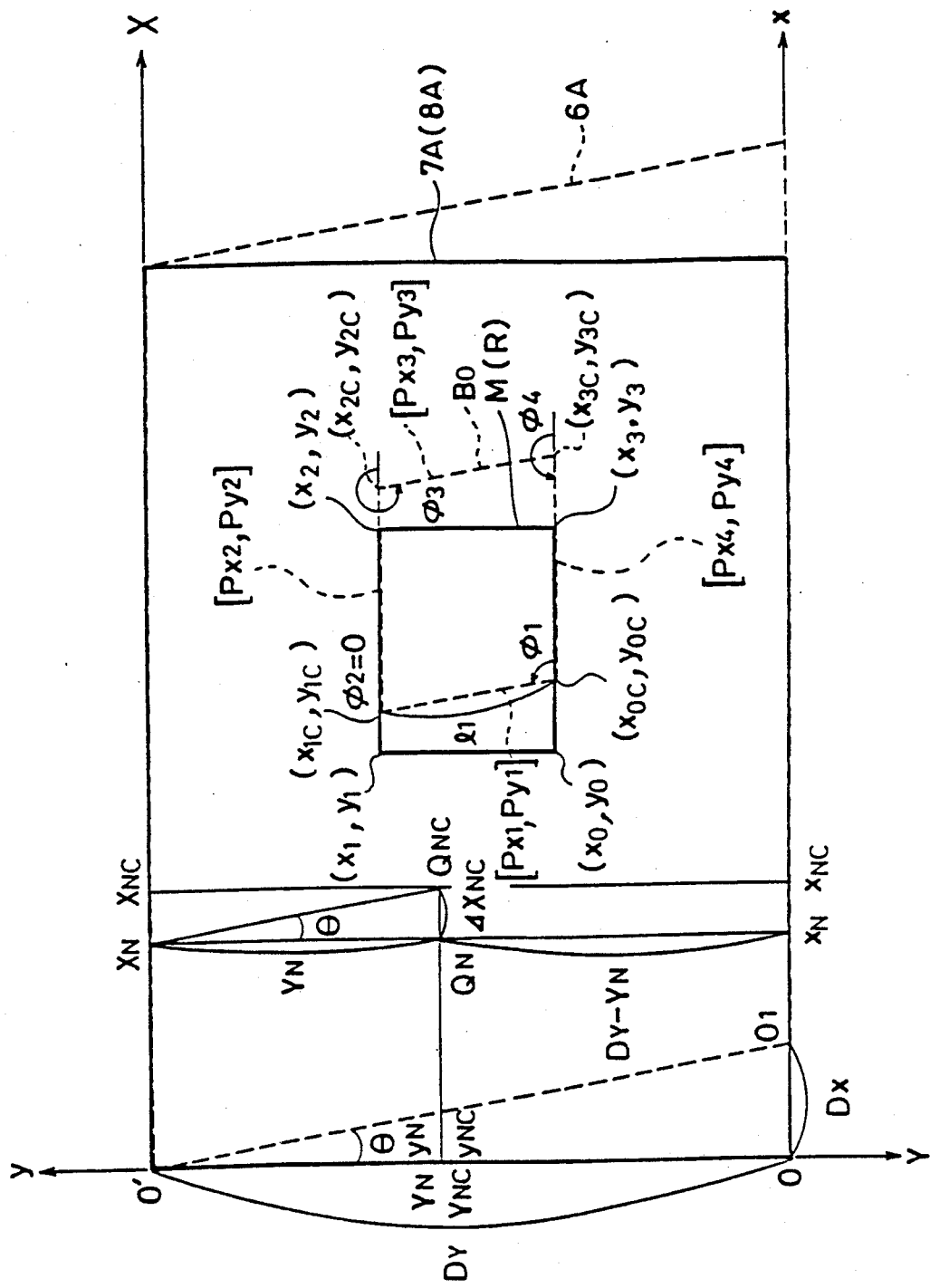
FIG. 11 is a graphical representation illustrating correction of coordinate values in accordance with one embodiment of the present invention.

The coordinate data of a rectangular trimming frame having four vertexes of $(x_0, y_0)$, $(x_1, y_1)$, $(x_2, y_2)$ and $(x_3, y_3)$ shown in FIG. 11 are stored in the floppy disk in a manner similar to FIG. 9. The coordinate data are corrected by calculation of the CPU 11. In addition, the number of pulses for driving the pulse motors are calculated by the CPU 11 and stored in the output buffer memory 82. Now, attention must be paid to the number of pulses Px in the x direction, the number of pulses Py in the y direction and the angle $\phi$ of the data in the output buffer memory 82. Conventionally, the following equations are applied, where k represents a constant for transforming "length" to "number of pulses":

$$x_1 = x_0 \\ x_3 = x_2 \\ y_2 = y_1 \\ y_3 = y_0 \tag{1}$$

accordingly, $$Px_1 = 0 \\ Py_1 = k(y_1 - y_0) \\ \phi_1 = \pi/2 \tag{2}$$

$$Px_2 = k(x_2 - x_1) \\ Py_2 = 0 \\ \phi_2 = 0 \tag{3}$$

$$Px_3 = 0 \\ Py_3 = k(y_3 - y_2) \\ \phi_3 = 3\pi/2 \tag{4}$$

$$Px_4 = k(x_0 - x_3) \\ Py_4 = 0 \\ \phi_4 = \pi \tag{5}$$

The indexes 1 to 4 indicate that the respective variables represent four sides of the trimming frame which have end points at $(x_1, y_1)$, $(x_2, y_2)$, $(x_3, y_3)$, and $(x_0, y_0)$, respectively.

Figure 5:
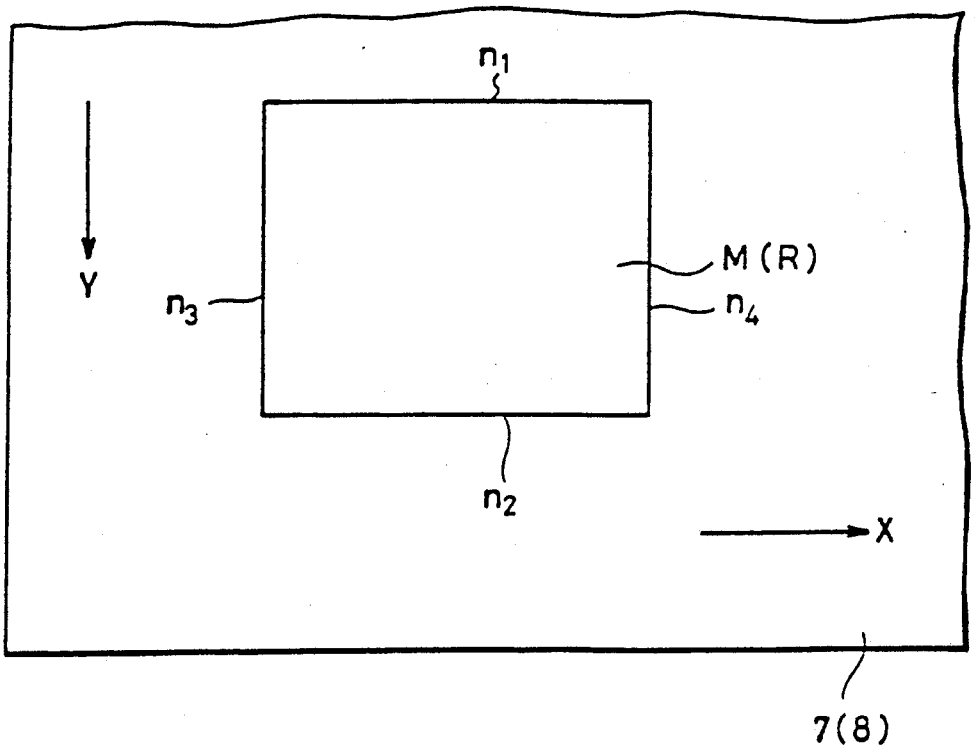

A case in which the numerical control unit 78 controls the cutter unit in accordance with the above described conventional output data is described. The masking portion M or the colorless transparent portion R fabricated in this manner is a rectangle such as is shown in FIG. 5 or FIG. 11. The angle $\phi$ is used to adjust the direction of the cutter 64 to the direction of movement of the cutter head. The cuter is adjusted since the blade of the cutter must be set in the direction of a movement of the cutter head to cut the peel-off film.

Now, in the embodiment of the present invention, the coordinate data stored in the input buffer memory 60 are corrected in the following manner by the CPU 11. Consider an X, Y rectangular coordinate system and an x, y rectangular coordinate system such as are shown in FIG. 11. The origin 0, of the X, Y rectangular coordinate system is a point from which scanning is started when the negative film 6 is fabricated by the layout system 5. The origin 0 of the x, y rectangular coordinate system is the origin of operation in the apparatus for fabricating a pre-press masking film.

A larger parallelogram 6A represented by dotted lines in FIG. 11 shows arranged images as a whole formed on the negative film 6 by means of the scanner from the layout system 5. A smaller parallelogram $B_0$ represented by the dotted lines shows one of the arranged images. Larger rectangles 7A and 8A represented by solid lines show portions of masking films 7 and 8 corresponding to the whole arranged images 6A of the negative film 6. The smaller rectangles M and R represented by the solid lines show the masking portion M or the colorless transparent portion R for one independent image formed on the masking film 7 or 8 in the conventional manner.

In the X, Y rectangular coordinate system, the coordinate value of an arbitrary point $Q_N$ on the portions 7A, 8A of the rectangular masking films 7, 8 is defined as $(N_N, Y_N)$. The rectangle on the portion 7A, 8A is tilted by a small angle $\theta$ along the x direction with the height in the Y direction maintained as it is. Consequently, a parallelogram of the whole images 6A is formed on the negative film 6. The coordinate of a point $Q_{NC}$ to which the point moves along with the tilt deformation is defined as $Y_{NC}, Y_{NC}$. Accordingly, the following equations can be applied.

$$X_{NC} = X_N + \Delta X_{NC} \tag{6}$$

$$\tan \Delta\theta = \Delta X_{NC}/Y_N \tag{7}$$

From the equations (6) and (7), $$X_{NC} = X_N + Y_N \tan \theta \tag{8}$$

and $$Y_{NC} = Y_N \tag{9}$$

The equations for transforming the X, Y rectangular coordinate system to the x, y rectangular coordinate system are represented by $$X_N = x_N$$

$$Y_N = D_Y - Y_N \tag{10}$$

Accordingly, the equations (8) and (9) can be changed into $$X_{NC} = x_N + (D_Y - Y_N) \cdot \tan \theta$$

$$Y_{NC} = Y_N \tag{11}$$

These equations represent the correction carried out by the CPU 11. The coordinate values provided by correcting the respective coordinate values $(x_0, y_0)$, $(x_1, y_1)$, $(x_2, y_2)$, and $(x_3, y_3)$ are defined as $(x_{0c}, y_{0c})$, $(x_{1c}, y_{1c})$, $(x_{2c}, y_{2c})$, and $(x_{3c}, y_{3c})$, respectively. A parallelogram connecting these corrected coordinates exactly corresponds to the parallelogram of the image $B_0$.

The number of pulses $Px_1$ in the x direction, the number of pulses $Py_1$ and the angle $\phi_1$ of the line from the point $(x_{0c}, y_{0c})$ to the point $(x_{1c}, y_{1c})$ are calculated as follows, with the term DY being eliminated.

$$Px_1 = k(x_{1c} - x_{0c}) \\ = k\{(x_1 - x_0) - (y_1 - y_0)\tan\theta\} \\ = -k(y_1 - y_0)\tan\theta$$

$$Py_1 = k(y_{1c} - Y_{0c}) \\ = k(y_1 - y_0)$$

-continued $$\phi_1 = \theta + \pi/2$$

In short, the following three equations are provided.

$$Px_1 = -k(y_1 - y_0)\tan\theta \quad (12)$$
$$Py_1 = k(y_1 - y_0)$$
$$\phi_1 = \theta + \pi/2$$

In the similar manner, the number of pulses $Px_2$ in the x direction, the number of pulses $Py_2$ in the y direction and the angle $\phi_2$ of the line from the point $(x_{1c}, y_{1c})$ to the point $(x_{2c}, y_{2c})$ can be represented by the following three equations.

$$Px_2 = k(x_2 - x_1) \quad (13)$$
$$Py_2 = 0$$
$$\phi_2 = 0$$

The following two sets of equations can be provided for the remaining two sides.

$$Px_3 = -k(y_3 - y_2)\tan\theta \quad (14)$$
$$Py_3 = k(y_3 - y_2)$$
$$\phi_3 = \theta + 3\pi/2$$

$$Px_4 = k(x_0 - x_3) \quad (15)$$
$$Py_4 = 0$$
$$\phi_4 = \pi$$

In FIG. 11, in correspondence with the distance $D_Y$ in the main scanning direction, the point of the image corresponding to the lowest point 0 at the left end of the rectangle 7A moves by the distance $D_X$ in the right to the point $0_1$. On this occasion, the angle of tilt deformation $\theta$ which is the angle O O, $O_1$ will be calculated as $$\theta = \tan^{-1}(D_x/D_y) \quad (16)$$

The peripheral length of the cylinder of the rotary cylinder scanner is defined as $d_Y$, and the length of movement of the exposure head along the axial direction of the cylinder during one rotation of the cylinder is
defined as $d_X$. The angle $\theta$ can be also calculated as $$\theta = \tan^{-1}(d_X/d_Y) \quad (17)$$

Actually, the length $d_Y$ is 0.5 m and the length $d_X$ is about 50 μm, for example, in the rotary cylinder scanner.

The above described angle of tilt deformation $\theta$ is set in advance in the EEPROM 14. The CPU 11 reads the angle of tilt deformation $\theta$ from the EEPROM 14 to store the same in the register. The coordinate data $(x_0, y_0)$ and $(x_1,y_1)$ of the first segment are read from the input buffer memory 60, and the correction is carried out based on the equations (11) for the correction. The number of pulses $Px_1$ in the x direction and the number of pulses $Py_1$ in the y direction are calculated by the CPU 11 based on the corrected coordinate values $(x_{0c}, y_{0c})$ and $(x_{1c}, y_{1c})$ The following equations are used for the calculation.

$$Px_1 = k(x_{1c} - x_{0c})$$
$$Py_1 = k(y_{1c} - y_{0c}) \quad (18)$$

The results of the calculation are stored in the output buffer memory 82.

In this embodiment, the rectangle is deformed into a parallelogram in accordance with the equations (11). As shown in FIG. 3, the negative film 6 to be corrected is laid over with the first mask film 7. On this occasion, the sides 7a and 7of the first masking film 7 are registered with sides 6a and 6of the negative film 6. By doing so, the image $B_0$ to be replaced is exactly registered with the masking portion M. Accordingly, the image $B_0$ of the negative film 6 can be properly registered with the masking portion M of the masking film 7.

Now, the angle of deformation $\theta$ is very small. Consequently, tan $\theta$ can be regarded as $\theta$. Accordingly, the equations (11) for the correction can be represented as follows.

$$x_{NC} = x_N + (D_Y - y_N)\theta$$
$$Y_{NC} = Y_N \quad (19)$$

In the equations (12) and (14), tan $\theta$ can be replaced by $\theta$.

The above described angle of tilt deformation $\theta$ varies corresponding to the type of the scanner employed for fabricating the negative film. Therefore, memory unit 96 is provided in the apparatus shown in FIG. 6 for storing in advance a plurality of tilt correcting data corresponding to a plurality of different types of scanners. A most suitable value is selected from the plurality of correcting values in the memory unit 96 by the tilt correction data selecting unit 98. In other words, the angle of tilt deformation $\theta$ set in the EEPROM 14 shown in FIG. 7 can be set in accordance with the type of the scanner employed in fabricating the negative film.

Figure 12:
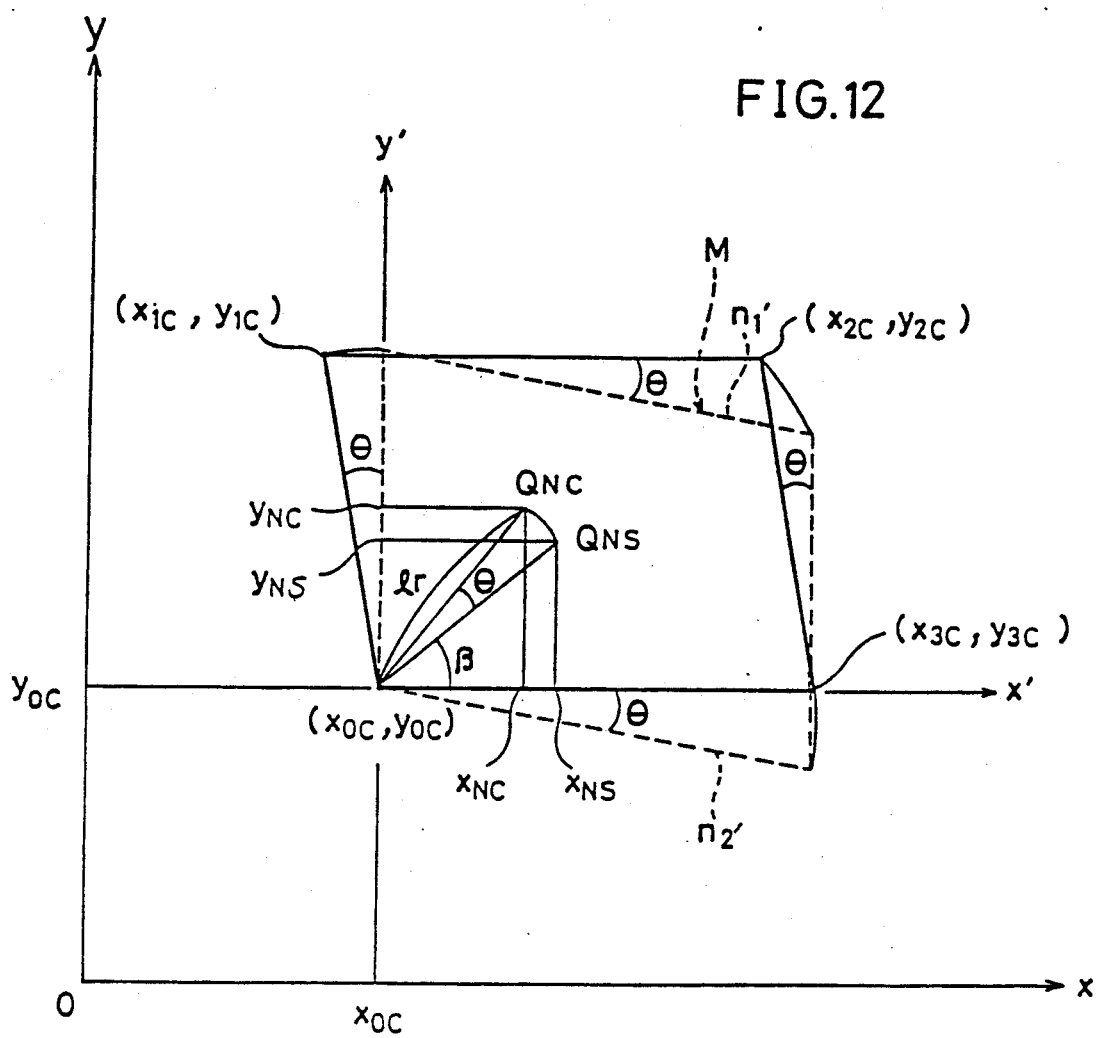
FIG. 12 illustrates correction of coordinate values in another embodiment of the present invention.

In the above described embodiment, a rectangle is deformed into a parallelogram by moving the same in parallel only in the x direction in accordance with the equations (11). There may be cases in which the coordinate values should be corrected such that the rectangle is moved along the y direction. Below, a description is given of such cases. Referring to FIG. 12, the parallelogram provided in the above described embodiment is further rotated clockwise by the angle $\theta$ about the point $(x_{0c}, y_{0c})$.

Assume x', y' rectangular coordinate system with the origin at the point $(x_{0c}, y_{0c})$. The coordinate value of the point in the x', y' rectangular coordinate system is defined as $(x_{NC}, y_{NC})$. The coordinate value of the point provided by rotating the point $Q_{NC}$ by the angle $\theta$ is defined as $(x_{NS}, y_{NS})$. The length of a segment between the point and the point $(x_{0c}, y_{0c})$ is represented as lr. The angle between the segment and the x' axis is represented by $\beta$. The following relations can be applied between respective coordinates of the points $Q_{NC}, Q_{NS}$ and lr, and $\beta$.

$$\cos \beta = x_{NS}/lr \quad (20)$$

$$\sin \beta = Y_{NS}/lr \quad (21)$$

$$x_{NC} = x_N - y_n \tan\theta$$
$$= lr \cos(\beta + \theta)$$
$$= lr (\cos\beta \cos\theta - \sin\beta \sin\theta)$$
$$= lr (x_{NS} \cos\theta/lr -$$
$$y_{NS} \sin\theta/lr)$$
$$= x_{NS} \cos\theta - y_{NS} \sin\theta$$

Therefore $$x_N - y_N \tan\theta = x_{NS} \cos\theta - y_{NS} \sin\theta \quad (22)$$
$$y_{NC} = y_N$$
$$= lr \sin(\beta + \theta)$$
$$= lr (\sin\beta \cos\theta + \cos\beta \sin\theta)$$
$$= lr (y_{NS} \cos\theta/lr +$$
$$x_{NS} \sin\theta/lr)$$
$$= y_{NS} \cos\theta + x_{NS} \sin\theta$$

Accordingly,
$$Y_N = Y_{NS} \cos\theta + x_{NS} \sin\theta \quad (23)$$

By substituting the equation (23) for the equation (22), $$x_N - (y_{NS} \cos\theta + x_{NS} \sin\theta)\tan\theta = x_{NS} \cos\theta - y_{NS} \sin\theta$$
$$x_N - y_{NS} \sin\theta - x_{NS} \sin^2\theta/\cos\theta = x_{NS} \cos\theta - y_{NS} \sin\theta$$
$$x_N = x_{NS} (\sin^2\theta + \cos^2\theta)/\cos\theta = x_{NS}/\cos\theta$$
$$x_{NS} = x_N \cos\theta \quad (24)$$

By substituting the equation (24) for the equation (23), $$Y_N = Y_{NS} \cos\theta + x_N \cos\theta \sin\theta$$

$$Y_{NS} = -x_N \sin\theta + y_N/\cos\theta \quad (25)$$

Returning to the x, y rectangular coordinate system from the x', y' rectangular coordinate system, the equations for transforming the coordinate values for the correction of tilt will be $$x_{NS} = x_N \cos\theta + x_{0c}$$

$$Y_{NS} = -x_N \sin\theta + y_N/\cos\theta + y_{0c} \quad (26)$$

Figure 1:
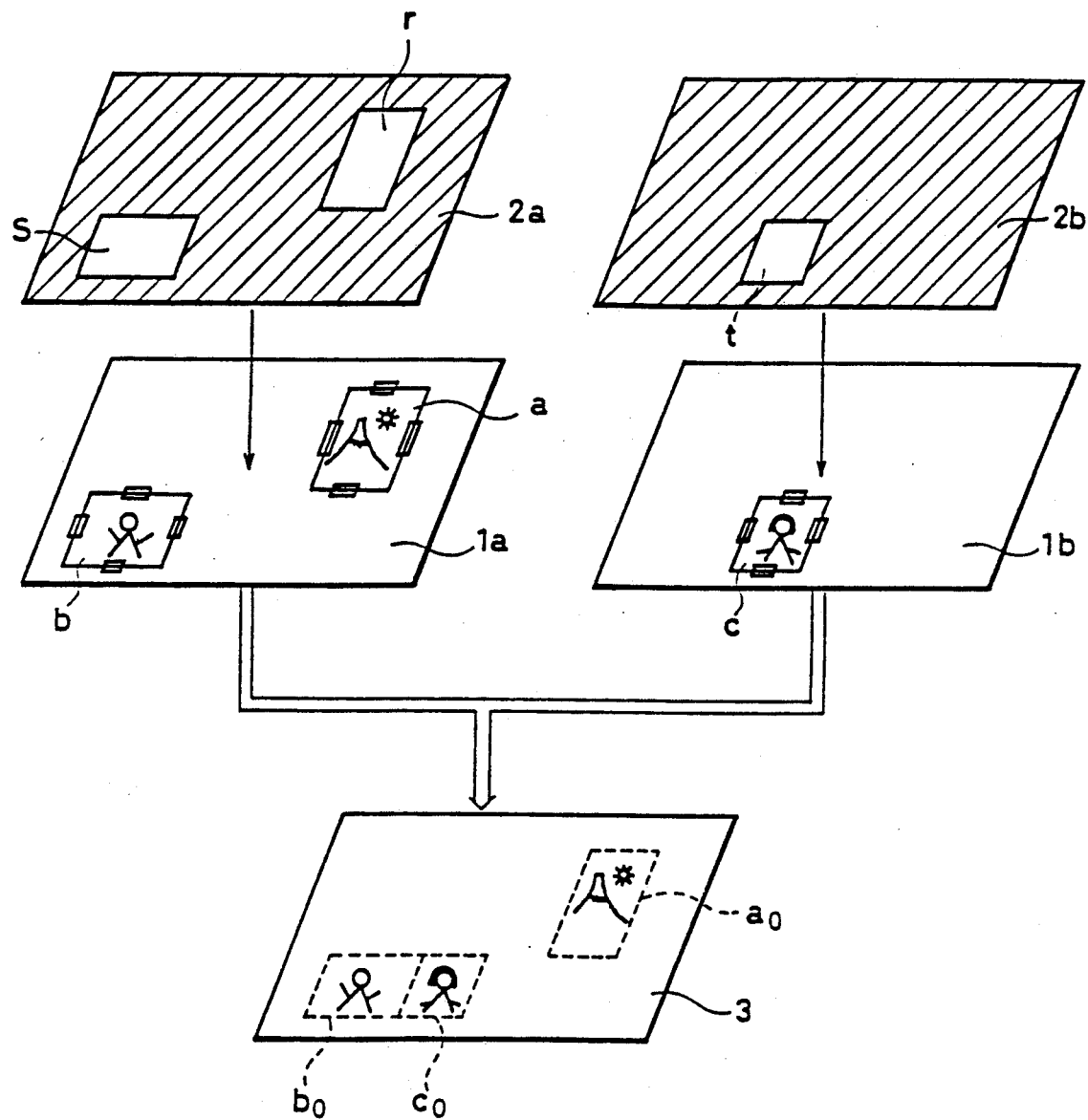
FIG. 1 is a schematic diagram showing a conventional pre-press process.
Figure 4:
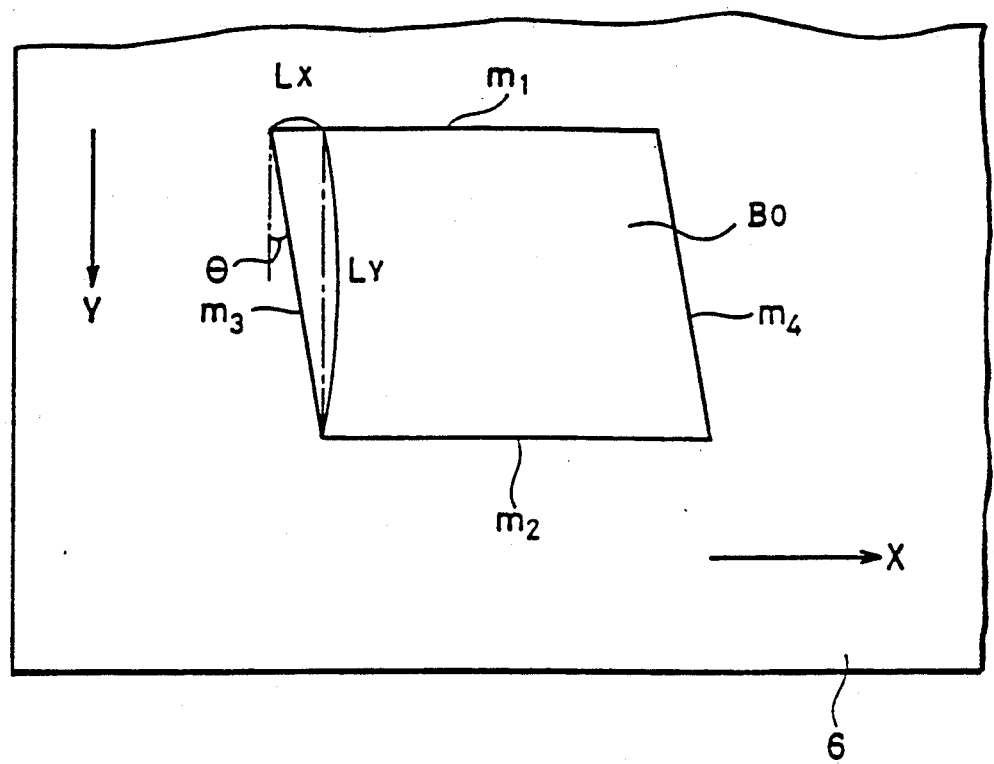
FIG. 4 and 5 are plan views of output images illustrating tilt deformation of images outputted from a scanner.

As shown in FIG. 4, the sides $m_1$ and $m_2$ of the image $B_0$ are parallel to the x axis. In this embodiment, however, the sides $n_1'$ and $n_2'$ of the corrected masking portion M are tilted from the x axis by the angle $\theta$ as shown in FIG. 12. Consequently, when the negative film 6 to be corrected is overlapped with the first masking film 7 such that the image $B_0$ to be replaced corresponds to the masking portion M, the position of the sides 6a and 6 of the negative film are not registered with the sides 7a and 7 of the first masking film 7. Therefore, the image $B_0$ must be exactly registered with the masking portion M by visual checking.

However, in departure from the prior art, if one pays close attention, the image $B_0$ can be registered with the masking portion M with high precision, since the shape of the image $B_0$ and the shape of the masking portion M conform to the same parallelogram.

Since the angle of tilt deformation $\theta$ is very small, $\cos\theta$ can be regarded as 1 and $\sin\theta$ can be regarded as $\theta$.

Accordingly, the equations (26) can be represented as follows.

$$x_{NS} = x_N + x_{0c}$$

$$Y_{NS} = -x_N\theta + y_N + Y_{0c} \quad (27)$$

The structure and operation of the apparatus is in other respects the same as in the above described embodiment.

Figure 13:
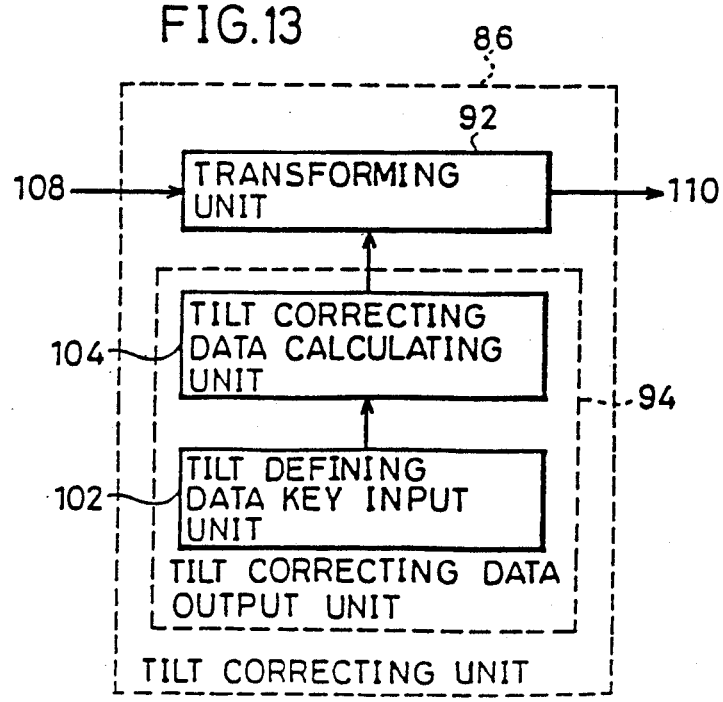
FIG. 13 is a partial block diagram of another embodiment of the present invention.

Instead of the tilt correcting data output unit 94 shown in FIG. 6, a tilt correcting data output unit 94 shown in FIG. 13 may be employed. The tilt correcting data output unit 94 comprises tilt defining data key input unit 102 by which an operator inputs information necessary for correction, and tilt correcting data calculating unit 104 for calculating respective constants in the equations for correction based on the inputted correction information.

For example, the operator inputs the amount of tilt deformation $D_X$, $D_Y$ (shown in FIG. 11) of the scanner by which the negative film is obtained, by means of the tilt defining data key input unit 102 such as a keyboard or the like. The tilt correcting data calculating unit 104 calculates the angle of tilt deformation $\theta$ in accordance with the equation (16) based on the inputted amount of tilt deformation. The result of the calculation is stored in the EEPROM 14. The transfer unit 92 corrects the coordinate values based on the above described angle of tilt deformation $\theta$. A microcomputer including the CPU 11 may be used also as the above described tilt correcting data calculating unit 104.

FIG. 14 is a flow chart showing the flow of control of the CPU 11 in accordance with the program stored in the ROM 12. The CPU 11 receives the amount of tilt deformation $D_X$ and $D_Y$ from the tilt defining data key input unit 102 in the step A1. In the step A2, the CPU 11 calculates the angle of tilt deformation $\theta$ in accordance with the equation (16). In the step A3, the CPU 11 stores the calculated angle of tilt deformation $\theta$ in the EEPROM 14. The steps A1 to A3 corresponds to the tilt correcting data calculating unit 104. In the step S1, the CPU 11 drives FDD 16 to read the coordinate data of the first segment stored in a floppy disk (not shown) to store the same in the input buffer memory 60. In the step S2, the data representing the angle of tilt deformation $\theta$ stored in the EEPROM 14 are transferred to the register. In the step S3, whether the final data in the floppy disk has been outputted or not is detected. If the answer is "YES", the program is terminated. If it is "NO", the flow proceeds to the step S4 in which the coordinate data stored in the input buffer memory 60 are transferred to the register. Thereafter, in the step S5, whether or not the correction is to be carried out is determined. In other words, whether the switch unit 108 is "ON" or "OFF" is detected. If the answer is "NO", the flow proceeds to the step S7. In the step S7, the coordinates are not corrected and the contents of the input buffer memory 60 are directly outputted to the RAM 13. Thereafter, the flow proceeds to the step S9. Meanwhile, if the answer is "YES" in the step S5, the flow proceeds to the step S6. In the step S6, calculation for correcting coordinate is carried out in accordance with the equation (11) on the inputted coordinate data for one segment. The corrected coordinate data are stored in the RAM 13 in the step S8. The step S5 corresponds to the correction selecting unit 106 and the steps S6 and S8 correspond to the transforming unit 92. Thereafter, in the step S9, the control information for driving the cutter unit 54 are calculated in accordance with the equations (12) to (15), for example, based on the corrected coordinate data stored in the RAM 13. The control information is stored in the output buffer memory 82 in the step S10. In the step S11, whether the data being processed are the data for the first segment or not is detected. If the answer is "YES", the flow of the control of the CPU 11 proceeds to the step S13. If the answer is "NO", the CPU 11 carries out the operation of the step S12 and thereafter the flow proceeds to the step S13. In the step S12, it is detected whether or not a signal indicating the end of cutting is applied from the numerical control unit 78 through the bus line 15. The CPU 11 is kept in a waiting state until the answer becomes "YES". When the answer of this step becomes "YES", the flow proceeds to the step S13. The step S12 is provided in order to synchronize the operation of the reading unit 58 and the cutter unit 54. In the step S13, the CPU 11 transmits a start instruction signal to the DMAC 19 through the bus line 15. In the step S14, the CPU 11 drives the FDD 16 to read the coordinate data of the next segment. The read coordinate data are stored in the input buffer memory 60. The control of the CPU 11 returns to the step S3. The operation is repeated until all data stored in the floppy disk (not shown) are processed. The operation of the CPU 11 from the step S9 to the step S13 corresponds to the calculating unit 80.

In the step S5, whether the switch unit 108 is "ON" or "OFF" is determined. However, the determination in the step S5 may be omitted. In that case, correction can be prevented by previously setting the angle of tilt deformation $\theta$ at 0.

In the preceding, description a case in which a rectangle is deformed into a parallelogram was explained. However, the present invention is not limited to the above example and it comprises coordinate correction of a circle, an ellipse and the like in accordance with other embodiments. The equations for correction are the same as in each of the above described embodiments when the trimming frame represented by these shapes are to be corrected. However, in processing circles and ellipses, these shapes are treated by approximating their shapes by means of polygons.

In the foregoing, the present invention was applied to a recorded image provided by a rotary cylinder scanner in which the recording head and the cylinder are relatively moved at a constant velocity in the subscanning direction. However, the application of the present invention is not limited to such devices. For example, it can be applied to systems where recorded images are provided on a flat bed type scanner.

Although the present invention has been described and illustrated in detail, it is to be understood that the same is by way of illustration and example only and is not to be taken by way of limitation, the spirit and scope of the present invention being limited only by the terms of the appended claims.

What is claimed is:

1. An apparatus for fabricating a masking film to be used in conjunction with an original layout apparatus, wherein said masking film is compensated for a coordinate data tilt which normally develops in said original layout apparatus as a result of the use therein of coordinate data which defines a shape of a given area of an original image, said apparatus for fabricating a masking film comprising:

coordinate data input means coupled to an image processing means for receiving therefrom said coordinate data;

correcting means coupled to said coordinate data input means for carrying out a correction and for producing thereby corrected coordinate data which is corrected for said coordinate data tilt;

first means responsive to said corrected coordinate data for generating driving signals for fabricating therewith said masking film;

second means responsive to said driving signals for fabricating said masking film;

said given area comprising an arbitrary polygon;

wherein said correcting means is operable in accordance with a valid mode in which said correcting means is enabled to carry out said correction and an invalid mode in which said correction means does not carry out said correction, and said apparatus for fabricating a masking film further comprises correction selection means for selecting either said valid mode or said invalid mode.

2. An apparatus according to claim 1, wherein said correction selecting means comprises switch means for detachably connecting said correcting means between said coordinate data input means and said first means.

3. An apparatus according to claim 2, wherein said switch means connects said correcting means between said coordinate data input means and said first means in said valid mode.

4. An apparatus according to claim 3, wherein said switch means directly connects said coordinate data input means to said first means in said invalid mode.

5. An apparatus for fabricating a masking film to be used in conjunction with an original layout apparatus, wherein said masking film is compensated for a coordinate data tilt which normally develops in said original layout apparatus as a result of the use therein of coordinate data which defines a shape of a given area of an original image, said apparatus for fabricating a masking film comprising:

coordinate data input means coupled to an image processing means for receiving therefrom said coordinate data;

correcting means coupled to said coordinate data input means for carrying out a correction and for producing thereby corrected coordinate data which is corrected for said coordinate data tilt;

first means responsive to said corrected coordinate data for generating driving signals for fabricating therewith said masking film;

second means responsive to said driving signals for fabricating said masking film;

said given area comprising an arbitrary polygon;

said coordinate data defining a prescribed coordinate system;

said prescribed coordinate system comprising a two dimensional rectangular coordinate system defined on a plane including said area corresponding to the original image;

said correction being effected by said correction means comprises moving the points constituting said area in a predetermined direction;

said moving of the points constituting the area comprising moving substantially all said points by a prescribed distance;

said correction being carried out based on tilt correcting data which defines said predetermined direction and said prescribed distance;
said correcting means comprises tilt correcting means for compensating for said tilt;
said two dimensional rectangular coordinate system comprises: an x axis in said predetermined direction, and a y axis orthogonally intersecting said x axis at a predetermined origin;
wherein a point $(X_N, Y_N)$ on said area corresponding to the original image is converted into a point $(X_{NC}, Y_{NC})$ in accordance with the following equation:

$$X_{NC} = X_N + (D_Y - Y_N) \cdot \tan \theta$$

$$Y_{NC} = Y_N$$

$\theta$ representing a first constant associated with an original reconstruction means of said original layout apparatus, $D_Y$ representing a predetermined second constant associated with said original reconstructing means.

6. An apparatus for fabricating a masking film to be used in conjunction with an original layout apparatus, wherein said masking film is compensated for a coordinate data tilt which normally develops in said original layout apparatus as a result of the use therein of coordinate data which defines a shape of a given area of an original image, said apparatus for fabricating a masking film comprising:
   coordinate data input means coupled to an image processing means for receiving therefrom said coordinate data;
   correcting means coupled to said coordinate data input means for carrying out a correction and for producing thereby corrected coordinate data which is corrected for said coordinate data tilt;
   first means responsible to said corrected coordinate data for generating driving signals for fabricating therewith said masking film;
   second means responsive to said driving signals for fabricating said masking film;
   said given area comprising an arbitrary polygon;
   said coordinate data defining a prescribed coordinate system;
   said prescribed coordinate system comprising a two dimensional rectangular coordinate system defined on a plane including said area corresponding to the original image;
   said correction being effected by said correction means comprises moving the points constituting said area in a predetermined direction;
   said moving of the points constituting the area comprising moving substantially all said points by a prescribed distance;
   said correction being carried out based on tilt correcting data which defines said predetermined direction and said prescribed distance;
   said correcting means comprises tilt correcting means for compensating for said tilt;
   said two dimensional rectangular coordinate system comprises: an x axis in said predetermined direction, and a y axis orthogonally intersecting said x axis at a predetermined origin;
   wherein a point $(X_N, Y_N)$ on said area corresponding to the original image is converted into a point $(X_{NC}, Y_{NC})$ in accordance with the following equation:

$$X_{NC} = X_N + (D_Y - Y_N) \cdot \theta$$

$$Y_{NC} = Y_N$$

$\theta$ representing a first constant associated with an original reconstruction means of said original layout apparatus, $D_Y$ representing a predetermined second constant associated with said original reconstructing means.

7. An apparatus according to claim 6, wherein said $\theta$ is in the range of zero to 1/10000.

8. An apparatus for fabricating a masking film to be used in conjunction with an original layout apparatus, wherein said masking film is compensated for a coordinate data tilt which normally develops in said original layout apparatus as a result of the use therein of coordinate data which defines a shape of a given area of an original image, said apparatus for fabricating a masking film comprising:
   coordinate data input means coupled to an image processing means for receiving therefrom said coordinate data;
   correcting means coupled to said coordinate data input means for carrying out a correction and for producing thereby corrected coordinate data which is corrected for said coordinate data tilt;
   first means responsive to said corrected coordinate data for generating driving signals for fabricating therewith said masking film;
   second means responsive to said driving signals for fabricating said masking film;
   said given area comprising an arbitrary polygon;
   said coordinate data defining a prescribed coordinate system;
   said prescribed coordinate system comprising a two dimensional rectangular coordinate system defined on a plane including said area corresponding to the original image;
   said correction being effected by said correction means comprises moving the points constituting said area in a predetermined direction;
   said moving of the points constituting the area comprising moving substantially all said points by a prescribed distance;
   said correction being carried out based on tilt correcting data which defines said predetermined direction and said prescribed distance;
   wherein said correction further comprises rotating said area by a prescribed angle about a predetermined center of rotation;
   wherein said correction is carried out based on tilt correcting data which defines said prescribed angle;
   wherein said two dimensional rectangular coordinate system comprises: an x axis in said predetermined direction, and a y axis orthogonally intersecting said x axis at a predetermined origin;
   wherein a point $(x_N, Y_N)$ on said area corresponding to the original image is converted to a point $(x_{NS}, Y_{NS})$ in accordance with the following equation:

$$X_{NS} = x_N \cos \theta + x_{0c}$$

$$Y_{NS}[+] = -x_N \sin \theta + Y_N/\cos \theta + Y_{0c}$$

the point ($x_{0c}$, $Y_{0c}$) representing said center of rotation, $\theta$ representing a first constant associated with an original reconstruction means of said original layout apparatus, $D_Y$ representing a predetermined second constant associated with said original reconstructing means.

9. An apparatus according to claim 8, wherein said $\theta$ is in the range of zero to 1/10000.

10. An apparatus for fabricating a masking film to be used in conjunction with an original layout apparatus, wherein said masking film is compensated for a coordinate data tilt which normally develops in said original layout apparatus as a result of the use therein of coordinate data which defines a shape of a given area of an original image, said apparatus for fabricating a masking film comprising:

coordinate data input means coupled to an image processing means for receiving therefrom said coordinate data;

correcting means coupled to said coordinate data input means for carrying out a correction and for producing thereby corrected coordinate data which is corrected for said coordinate data tilt;

first means responsive to said corrected coordinate data for generating driving signals for fabricating therewith said masking film;

second means responsive to said driving signals for fabricating said masking film;

said given area comprising an arbitrary polygon;

said coordinate data defining a prescribed coordinate system;

said prescribed coordinate system comprising a two dimensional rectangular coordinate system defined on a plane including said area corresponding to the original image;

said correcting being effected by said correction means comprises moving the points constituting said area in a predetermined direction;

said moving of the points constituting the area comprising moving substantially all said points by a prescribed distance;

said correction being carried out based on tilt correcting data which defines said predetermined direction and said prescribed distance;

wherein said correction further comprises rotating said area by a prescribed angle about a predetermined center of rotation;

wherein said correction is carried out based on tilt correcting data which defines said prescribed angle;

wherein said two dimensional rectangular coordinate system comprises: an x axis in said predetermined direction, and a y axis orthogonally intersecting said x axis at a predetermined origin;

wherein a point ($x_N$, $Y_N$) on said area corresponding to the original image is converted to a point ($x_{NS}$, $Y_{NS}$) in accordance with the following equation:

$$X_{NS} = x_N + x_{0c}$$

$$Y_{NS}[+] = -x_N\theta + Y_N + Y_{0c}$$

the point ($x_{0c}$, $Y_{0c}$) representing said center of rotation, $\theta$ representing a first constant associated with an original reconstruction means of said original layout apparatus, $D_Y$ representing a predetermined second constant associated with said original reconstructing means.

11. An apparatus according to claim 10, wherein said $\theta$ is in the range of zero to 1/10000.

* * * * *